United States Patent [19]
Shen et al.

[11] Patent Number: 5,130,574
[45] Date of Patent: Jul. 14, 1992

[54] PROGRAMMABLE LOGIC DEVICE PROVIDING PRODUCT TERM SHARING AND STEERING TO THE OUTPUTS OF THE PROGRAMMABLE LOGIC DEVICE

[75] Inventors: Ju Shen, San Jose; Albert L. Chan, Palo Alto; Kapil Shankar, San Jose, all of Calif.; Cyrus Tsui, Vancouver, Wash.

[73] Assignee: Lattice Semiconductor Corporation, Hillsboro, Oreg.

[21] Appl. No.: 696,461

[22] Filed: May 6, 1991

[51] Int. Cl.⁵ .................................. H03K 19/177
[52] U.S. Cl. .................................. 307/465; 307/243
[58] Field of Search .................. 307/465–469, 307/243

[56] References Cited

U.S. PATENT DOCUMENTS

| | | | |
|---|---|---|---|
| 4,758,746 | 7/1988 | Birkner et al. | 307/465 |
| 4,825,105 | 4/1989 | Hölzle | 307/243 X |
| 4,879,481 | 11/1989 | Pathak et al. | 307/465 |
| 4,910,417 | 3/1990 | El Gamal et al. | 307/465 |
| 4,942,319 | 7/1990 | Pickett et al. | 307/468 X |
| 4,967,107 | 10/1990 | Kaplinsky | 307/465 |
| 4,983,959 | 1/1991 | Breuninger | 307/465 X |
| 5,003,202 | 3/1991 | Keida | 307/465 |
| 5,053,646 | 10/1991 | Higuchi et al. | 307/465 |

Primary Examiner—David Hudspeth
Attorney, Agent, or Firm—Skjerven, Morrill, MacPherson, Franklin & Friel

[57] ABSTRACT

A programmable logic device is disclosed which includes a programmable AND array, a plurality of logic circuits connected to groups of product term outputs from the AND array for performing a logical OR operation of the product term inputs and the programmable logic device includes programmable OR circuitry for selectively connecting one or more of the ORed groups of product terms to one or more outputs of the programmable logic device. The programmable OR circuit permits product term steering and sharing.

7 Claims, 4 Drawing Sheets

PROGRAMMABLE LOGIC DEVICE PROVIDING PRODUCT TERM SHARING AND STEERING TO THE OUTPUTS OF THE PROGRAMMABLE LOGIC DEVICE

BACKGROUND OF THE INVENTION

1. Field of the Invention

This invention relates generally to the field of programmable logic devices, and more particularly to programmable logic devices providing product term signals at its outputs.

2. Description of the Prior Art

Various types of programmable logic devices are known in the prior art. Referring to FIG. 1, a first type of programmable logic device 1 known in the prior art is illustrated, and is generically referred to as a PLA (programmable logic array). Referring to FIG. 1, programmable logic array 1 is comprised of a programmable AND array 2, shown in simplified form as having logical inputs A, $\overline{A}$ and B, $\overline{B}$ as the inputs to the programmable AND array. Included within programmable AND array 2 are a plurality of programmable logic elements, which may be, for example, nonvolatile memory cells, for selectively connecting the logical input signals provided on lines 3, 4, 5 and 6 to array lines (not shown) in programmable AND array 2. Based on the programmed or unprogrammed state of cells at the intersection between the array lines of the AND array and the product term lines (illustrated in FIG. 1 as PT0, PT1, PT2, and PT3) and the logical signals provided to the inputs of programmable AND array 2, product term output signals are provided on product term lines. The outputs from programmable AND array 2 are provided over lines PT0-PT3 as inputs to programmable OR array 7. In programmable logic array 1, both programmable AND array 2 and programmable OR array 7 are fully programmable, meaning any one of the inputs to either array may be connected to any one of its outputs. The outputs from programmable OR array 7 are indicated at 8, 9, 10 and 11. It is at these outputs that the logical result is provided based upon the inputs A, $\overline{A}$ and B, $\overline{B}$ and the programmed state of programmable AND array 2 and programmable OR array 7. Although programmable logic array 1 is very flexible due to its high connectability, it suffers from the disadvantage of speed and the requirement of a larger die size over other types of programmable logic devices.

A second type of prior art programmable logic device is illustrated in FIG. 2. Programmable logic device 15 illustrated in FIG. 2 is generally referred to as a PAL device. PAL device 15 is comprised of a programmable AND array 16, which is shown in simplified form, and includes array lines (not shown) for receiving logical input signals A, $\overline{A}$ and B $\overline{B}$. Based on the programmed-/unprogrammed state of devices in programmable AND array 16, product term output signals are provided on product term lines PT0, PT1, PT2, and PT3. Product term signals provided over these lines are inputs to fixed OR gates 17 and 18, and the resulting logical output is provided at terminals 19 and 20. It will of course be appreciated that the logical outputs at terminals 19 and 20 are a function of the programmed-/unprogrammed state of the cells in programmable AND array 16 and the result of ORing those signals by fixed OR gates 17 and 18. PAL device 15, although faster than PLA device 1, has less flexibility in terms of the logical results obtainable since the product term outputs from programmable AND array 16 are dedicated to predetermined OR gates.

SUMMARY OF THE INVENTION

It is an object of the present invention to provide a programmable logic device which provides better utilization of product terms generated by the programmable logic device.

In accordance with the present invention, a programmable logic device is provided which comprises a programmable AND array having a plurality of array lines for receiving logical input signals and a plurality of product terms for providing logical output signals based on the programmed state of devices in the programmable AND array. The product term outputs from the programmable AND array are divided into groups which are connected to the inputs of logic blocks which perform the logical OR function, and the outputs from the logical OR functional blocks are provided to a programmable OR circuit which permits the connection of one or more of each of the outputs from the logical OR functional blocks to be connected to any one or more of the outputs of the programmable OR circuit. The programmable OR circuit permits the steering of the outputs from the logical OR functional blocks providing the OR function to any one of the outputs of the programmable OR circuit and also permits the sharing of the outputs from the logical OR functional blocks among the outputs from the programmable OR circuit. The programmable OR circuit permits both steering and sharing of grouped product term outputs from the logical OR functional blocks, thereby better utilizing the product terms received from the programmable AND array.

BRIEF DESCRIPTION OF THE DRAWINGS

Other objects and advantages of the invention will become apparent from a study of the specification and drawings in which:

FIG. 4 illustrates the manner in which FIG. 4A and 4B should be arranged to illustrate detailed circuitry of the preferred embodiment of the present invention.

DETAILED DESCRIPTION OF THE INVENTION

Figure 3:
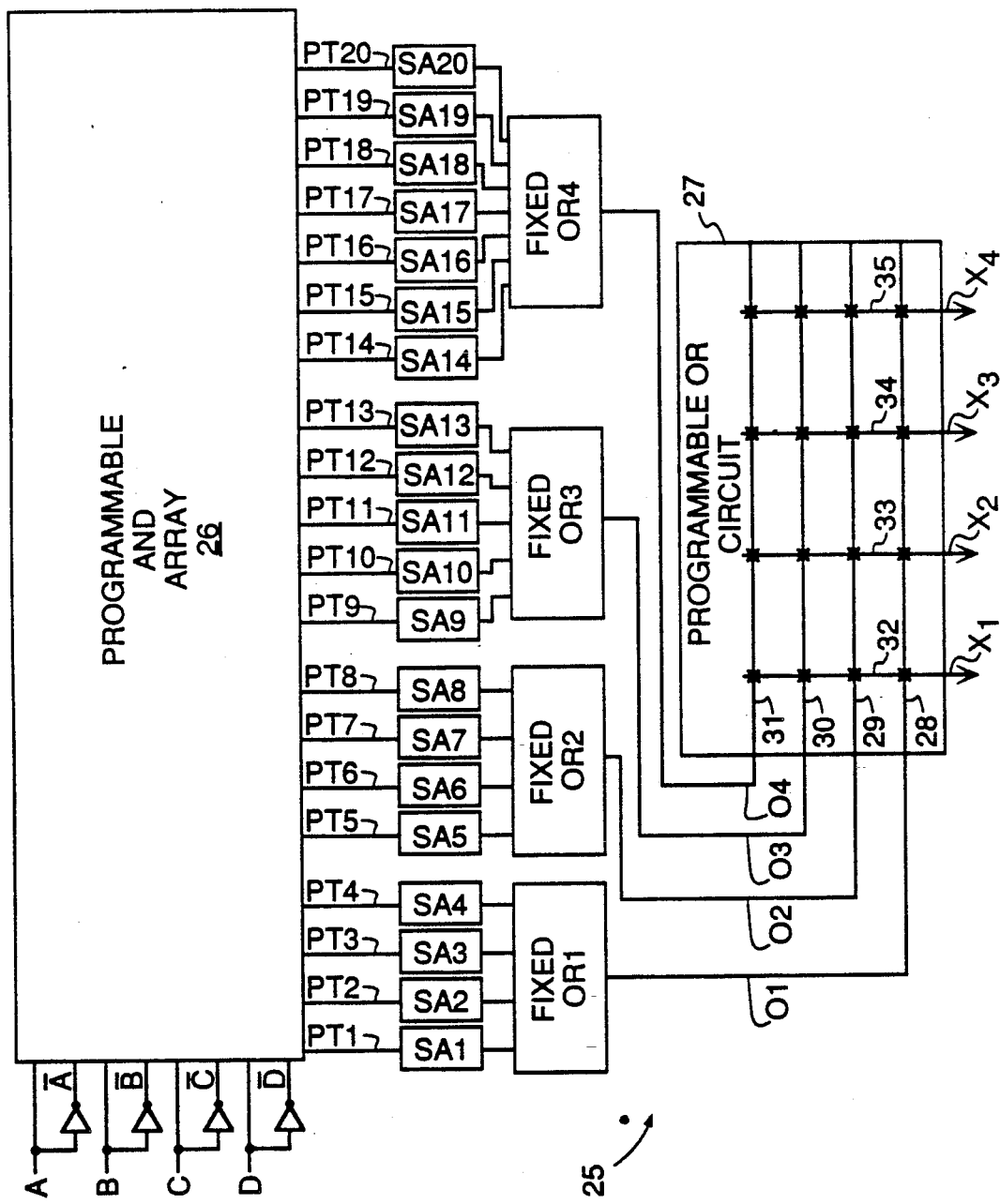
FIG. 3 illustrates in highly simplified and block diagram form one embodiment of the present invention.

Referring to FIG. 3, programmable logic device 25 in accordance with the present invention is illustrated in block diagram form. Programmable logic device 25 includes programmable AND array 26, which may take the form of programmable AND arrays well known to those skilled in the art. Typical programmable AND arrays include EEPROM memory cells at the intersection of the orthogonal array of array lines (arranged in rows and not shown in FIG. 3) which receive logical inputs from external sources and provide on product term outputs, which are connected to product term lines (not shown) which are arranged in columns within the array, signals based upon the logical input signals provided to the array and the programmed/unprogrammed state of the memory cell at the intersection of the array lines and product term lines. It will of course be appreciated that programmable AND array 26 is shown in highly simplified form since normally it would include sixteen logical inputs rather than the inputs A-D and their complements as indicated in FIG. 3.

Product term outputs from programmable AND array 26 are indicated by PT1-PT20, thereby providing 20 produce term outputs from programmable AND array 26. The logical outputs on product term lines PT1-PT20, which are based on the logical input signals to programmable AND array 26, are sensed by the sense amplifier connected to its associated product term line. Sense amplifiers of the type illustrated in U.S. Pat. No. 4,833,646 to Turner, issued May 23, 1989 and assigned to the assignee of the present invention may be utilized in practicing the present invention. The Turner patent is incorporated herein by reference in its entirety. Additionally, a sense amplifier as described and claims in U.S. Pat. application Ser. No. 695,181, filed May 3, 1991, entitled "Sense Amplifier with Depletion Transistor Feedback" by Ju Shen, Albert Chan and Chan-Chi J. Cheng, which is assigned to the assignee of the present invention, may alternatively be utilized. This application is incorporated herein by reference in its entirety.

Figure 1:
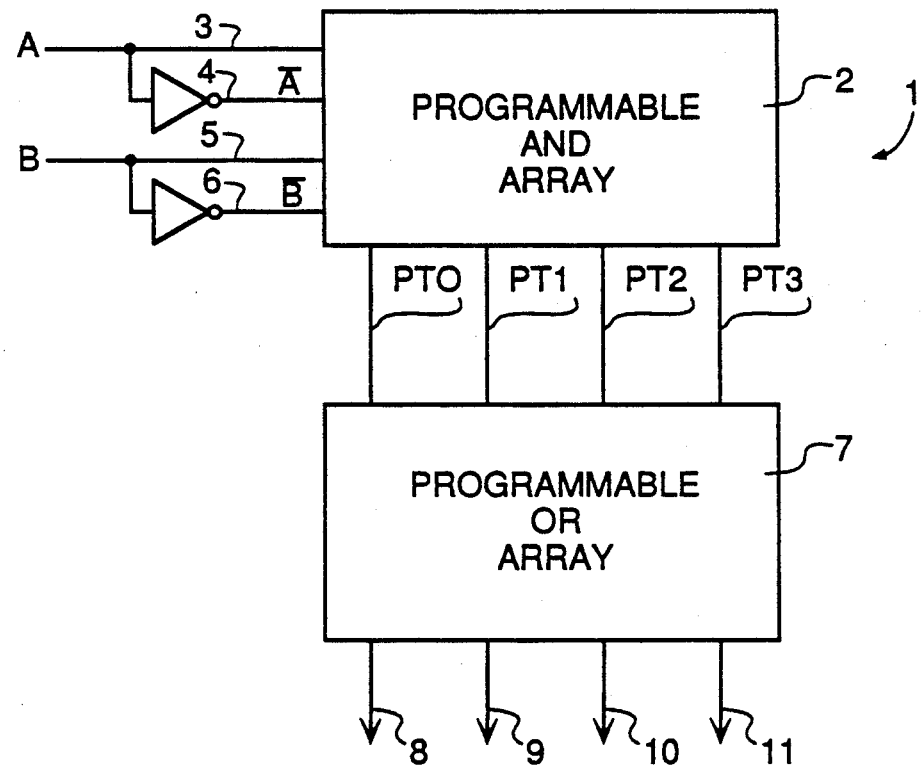
FIG. 1 illustrates a programmable logic device of the prior art.
Figure 2:
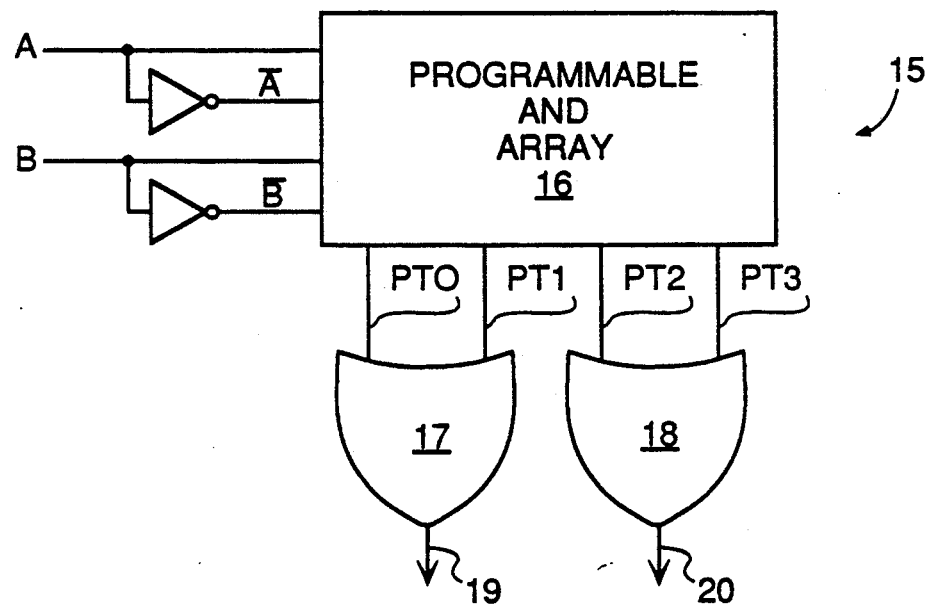
FIG. 2 illustrates another programmable logic device in accordance with the prior art.

The product terms from programmable AND array 26 are partitioned into four groups, of varying number of product terms. The selection of the numbers of product terms per group is arbitrary and would be selected based on the type of logical functions generally being utilized by the device. In the embodiment illustrated in FIG. 3, the 20 product terms are divided into four having 4, 4, 5, and 7 product terms each. The outputs from the sense amps associated with product terms PT1-PT4 are provided to the input of fixed OR1 logic block which provides a logical OR function at its output over line 01. Similarly, the outputs of the sense amplifier is associated with product terms PT5-PT8 provided to fixed OR2 logic block, which provides an OR logic function with respect to the product term inputs, the output of fixed OR2 logic block being provided over line 02. The third group of product terms, comprising PT9-PT13, are associated with and are inputs to fixed OR3 logic block which provides an OR output over line 03 of the logical inputs from the associated product terms. The fourth group of product term signals from programmable AND array 26 comprises a group of 7 product terms (PT14-PT20). The outputs of the associated sense amplifiers for these seven product terms are provided as inputs to fixed OR4 logic block and the logical output of this grouping is provided over line 04. Additional flexibility in the utilization of the product terms from programmable AND array 26 is achieved through the combination of the use of the fixed OR groupings of product terms in conjunction with programmable OR circuit 27 which performs a programmable OR operation, which is illustrated in FIG. 3 in block diagram form. The inputs to programmable OR circuit 27 are arranged, for illustrative purposes, as row inputs 28, 29, 30 and 31 which are connected to outputs 01, 02, 03, and 04 respectively. The product term outputs from programmable OR circuit 27 are indicated at $X_1$, $X_2$, $X_3$, and $X_4$. Within programmable OR circuit 27 column lines 32, 33, 34 and 35 are connected respectively to output terminals $X_1$, $X_2$, $X_3$ and $X_4$. At the intersection of row lines and column lines an "X" utilized to indicate a programmable and reprogrammable OR, thereby making possible the selective connection of the ORed outputs from the fixed OR logic blocks to any one or more of the product term outputs $X_1$-$X_4$. Various forms of programmable OR means may be utilized in practicing the present invention. The preferred form is illustrated in FIG. 4B, which will be described in detail hereinafter, wherein a programmable MUX having a control input terminal, is utilized to provide the selective connection of the fixed OR outputs to any one or more of the product term outputs $X_1$-$X_4$ from programmable OR circuit 27. By inserting the fixed OR logic blocks between programmable AND array 26 and programmable OR circuit 27, a smaller propagation delay is achieved when compared with using programmable logic device 1 of FIG. 1. Compared with programmable logic device 15 (FIG. 2), the present invention provides more flexibility in terms of the number of product terms available at each output and better utilization of the product terms.

It will be appreciated that by utilizing the programmable OR availability provided by programmable OR circuit 27 that the product term outputs from the fixed OR logic blocks (OR1, OR2, OR3 and OR4) may be steered to any one or more of the product term outputs $X_1$ through $X_4$. With this ability, it is also possible to share the outputs from several of the fixed OR logic blocks OR1-OR4 at outputs $X_1$ through $X_4$. For example, by programming the connection at the intersection of rows 28, 29, 30 and 31 with the column 32, the result of the twenty product terms PT1-PT20 may be obtained at output $X_1$. By programming the intersection of row 28 and column 33 at the same time, an output of four product terms PT1-PT4 can be obtained at output $X_2$, therefore the two outputs ($X_1$ and $X_2$) share the same four product term logic Of course with the programmability of the programmable OR circuit 27, other combinations of product terms with the outputs may be achieved. Although the number of outputs from programmable OR circuit 27 in the embodiment illustrated is equal to the number of inputs, it will of course be appreciated that additional numbers of outputs from programmable OR circuit 27 may be desirable and be incorporated into the circuit. Additionally, the number of product terms for each group in the fixed ORing of product terms from programmable AND array 26 may be arranged differently than that illustrated in FIG. 3 and the selection in the number of product terms for each group is arrived at based on the consideration of the logical functions which would likely be performed by the programmable logic device.

Figure 4A:
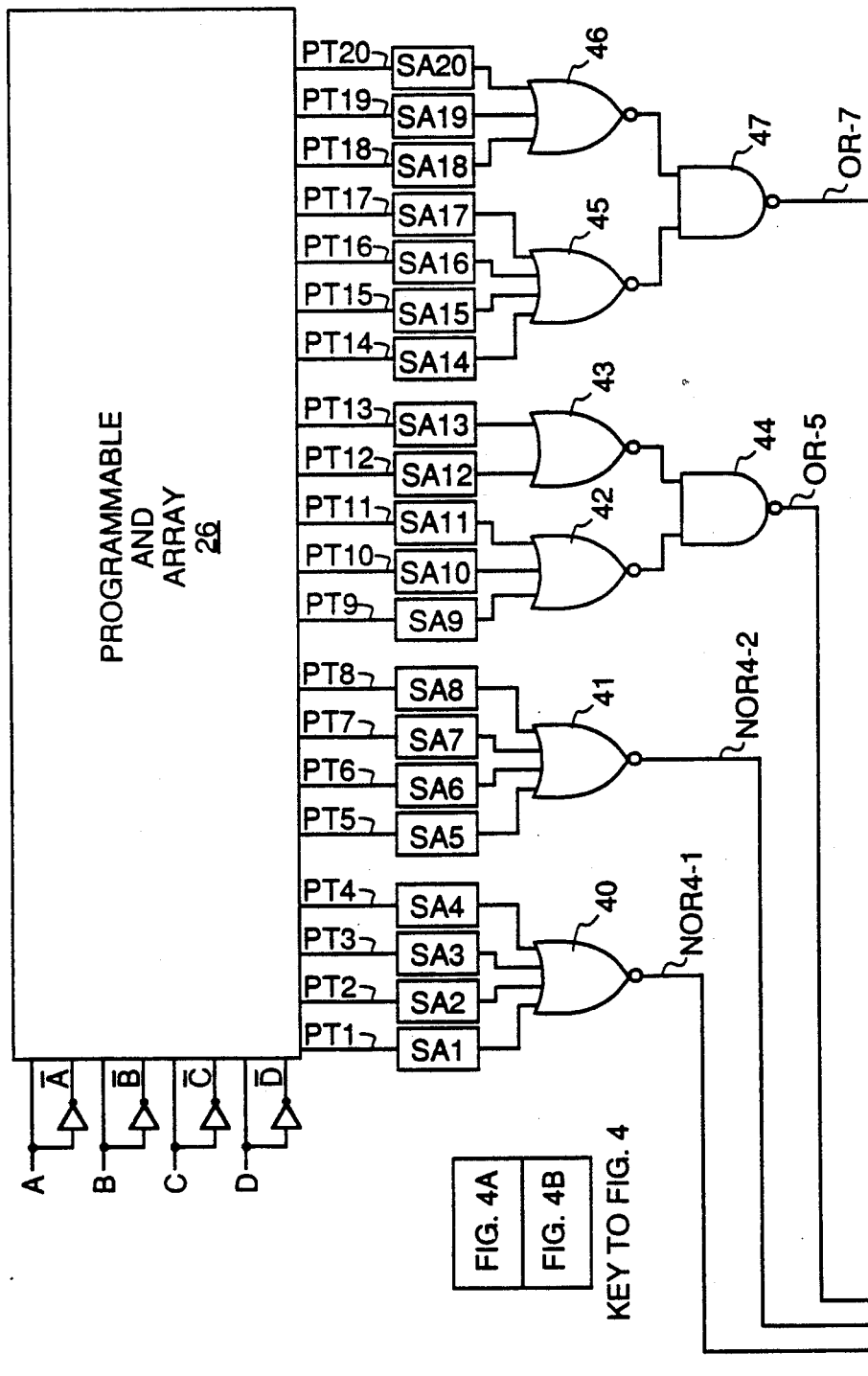
FIGS. 4A and 4B illustrates schematically the referred circuitry utilized for providing product term steering and sharing in accordance with the present invention.
Figure 4B:
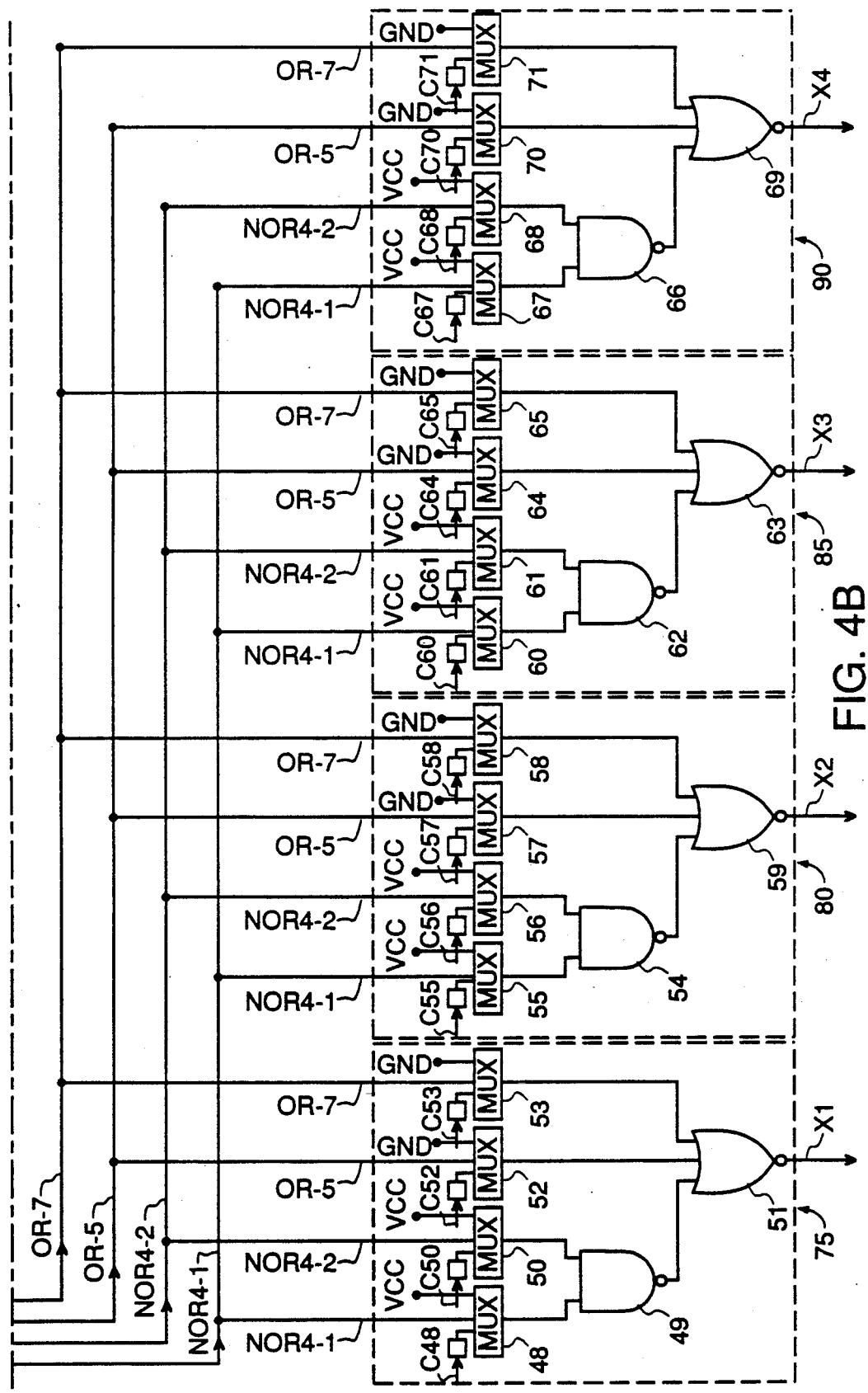

The detailed circuitry for implementing the product term sharing and steering of the present invention is illustrated in FIGS. 4A and 4B. These figures should be arranged as indicated in FIG. 4. Referring to FIG. 4A, product terms PT1 through PT4 from programmable AND array 26 are provided as the inputs to NOR gate 40. The output from NOR gate 40 is provided over line NOR4-1 for selective connection, through circuitry in FIG. 4B which is described fully hereinafter, to any of outputs $X_1$, $X_2$, $X_3$ or $X_4$. The outputs from product terms PT5 through PT8 are coupled by sense amplifiers SA5 through SA8 respectively to NOR gate 41, the output of which is provided over line NOR4-2 for selective connection to any of the four circuit outputs $X_1$ through $X_4$.

In the third group of product terms (which is comprised of product terms PT9-PT13) the outputs of sense amps SA9, SA10 and SA11 are connected as inputs to NOR 5 gate 42 and the outputs of sense amplifiers SA12 and SA13 are provided as inputs to NOR gate 43. The outputs of NOR gates 42 and 43 are connected to the input of NAND gate 44, the output of which is provided at line OR-5. In similar fashion to outputs NOR 41 and NOR 42, output OR-5 is selectively available to one or more of outputs $X_1$ through $X_4$. In the fourth group of grouped product terms, product terms PT14 through PT17 are provided as inputs through their respective sense amplifiers to NOR gate 45 (which is associated with product terms PT14 through PT17) and product terms PT18–PT20 are provided as inputs through their respective sense amplifiers to NOR gate 46 (which is associated with product terms PT18 through PT20). The output from NOR gate 45 and NOR gate 46 are inputs to NAND gate 47, the output of which is provided over line OR-7. As will be appreciated by viewing FIG. 4B, the output of NAND gate 47 is selectively connectable to any one of the final product term outputs $X_1$, $X_2$, $X_3$ or $X_4$.

Referring to FIG. 4B, outputs over NOR4-1, NOR4-2, OR-5 and OR-7 are connected to each of the four output circuits 75, 80, 85 and 90 (indicated by the dashed line blocks), and therefore by appropriate programming, one or more of these groups of product term lines may be provided at any of the four outputs $X_1$ through $X_4$. The programming of which of the outputs from the grouped logic terms are provided at the ultimate output of the circuit is determined by the user and controlled by placing a "1" or "0" in memory architecture bits for either permitting the connection or not permitting the connection of the output to the final product terms outputs $X_1$–$X_4$. More particularly, referring to output circuit 75 (in the lower left portion of FIG. 4B), MUX 48 provides for the selective connection of line NOR4-1 or VCC to NAND gate 49 and MUX 50 controls the connection of NOR4-2 or VCC to NAND gate 49. The output of NAND gate 49 is one of three inputs provided to NOR gate 51, the output of which is provided at terminal $X_1$. The remaining inputs to NOR gate 51 are provided through MUX 52 and MUX 53 which provide the selective connection to NOR gate 51 of the signals on OR-5, OR-7 or GND. Each MUX includes an input terminal for passing VCC or ground (providing a logic "1" or "0") at the output of the MUX. A control terminal indicated by C48 for MUX 48, C50 for MUX 50, C52 for MUX 52 and C53 for MUX 53 provides for selection of one or the other of the inputs to the MUX to pass through the MUX. For example in the case of MUX 48, depending on the control signal provided to C48, either NOR4-1 or VCC will be passed through MUX 48 to NAND gate 49. The control terminals for each MUX is connected to an architecture memory bit which stores the "1" or "0" to control which of the inputs will be provided at the output of the MUX. The program memory could be located on the PLD. It will of course be appreciated that other forms of connection control devices may be utilized to selectively connect the outputs from the grouped product terms to final outputs $X_1$ through $X_4$. Output circuit 80 for providing an output on terminal $X_2$ includes NAND gate 54 which receives inputs from NOR4-1, NOR4-2 or VCC via MUX 55 and 56 respectively. MUX 57 and MUX 58 provide for selective connection of OR-5, OR-7, or GND to NOR gate 59. In output circuit 85, MUX 60 selectively provides an input to NAND gate 62 of NOR4-1 or VCC, and MUX 61 also selectively provides an input to NAND gate 62 of signal NOR4-2 or VCC. The output of NAND gate 62 is one of the three inputs to NOR gate 63. The two other inputs to NOR gate 63 are provided via MUX 64 and MUX 65, which are connected to OR-5, OR-7 and GND.

In output circuit 90, which provides an output to terminal $X_4$, there is included NAND gate 66 receiving inputs from MUX 67 and MUX 68, with the output of NAND gate 66 providing an input to NOR gate 69. MUX 70 connects OR-5 or GND to NOR gate 69 and MUX 71 connects OR-7 or GND to NOR gate 69.

It will of course be appreciated by those skilled in the art that the ORing of groups of product terms could be achieved by utilizing a group consisting exclusively of OR gates. However, the preferred arrangement illustrated in FIG. 4A and 4B is advantageous because it provides a smaller propagation delay and a uniform delay across all of the four outputs ($X_1$, $X_2$, $X_3$ and $X_4$) Similarly, as pointed out above the programmable OR could be made with other techniques rather than using a MUX to provide this selective connection.

The foregoing illustrates several embodiments of the present invention, however various modifications and variations from these embodiments may be made by those skilled in the art without departing from the spirit and scope of the invention. It is of course also understood that the invention is not limited by the foregoing description and is defined by the following claims.

We claim:

1. A programmable logic device comprising:
a programmable AND array having a plurality of array lines for connection to a plurality of logical input signals and a plurality of product terms selectively connectable to said array lines to provide logical signals on M product term outputs from said AND array;
a plurality of first logic circuit blocks, N in number, each logic circuit block having a plurality of input terminals and an output terminal, and each of said first logic blocks performing the logical OR function;
means connecting N mutually exclusive groups of said M product term outputs to the inputs of respective ones of said first logic circuit blocks;
a programmable connection circuit having N inputs and X outputs, said programmable circuit including means for programmably ORing any one or more of said N inputs to any one or more of said X outputs;
means connecting the outputs of said first logic circuit blocks to respective ones of said N inputs of said programmable connection circuit.

2. The circuit according to claim 1, wherein the number of product term inputs to one of said first logic circuit blocks is less than the number of product term inputs to another of said first logic circuit blocks.

3. The circuit according to claim 1, wherein the same number of product term inputs are provided to each of said first logic circuit blocks.

4. The circuit according to claim 1, wherein X=N.

5. The circuit according to claim 1, wherein X is not equal to N.

6. The circuit according to claim 1, wherein said programmable connection circuit includes N input lines and X output lines arranged in an orthogonal array and a multiplexer circuit is provided at the intersection of each of said N input lines with said X output lines, and wherein each multiplexer includes a control input terminal for receiving a control signal, whereby upon application of a control signal to respective ones of said multiplexer circuits each of said N input lines can be connected to one or more of said X output lines.

7. The circuit according to claim 6, further including memory means for storing control bits to provide control signals for application to the control input terminal of said multiplexers, and means connecting storage locations of said memory means to said control input terminals.

* * * * *

UNITED STATES PATENT AND TRADEMARK OFFICE
CERTIFICATE OF CORRECTION

PATENT NO.   : 5,130,574
DATED        : July 14, 1992
INVENTOR(S)  : Ju Shen et al.

It is certified that error appears in the above-identified patent and that said Letters Patent is hereby corrected as shown below:

Col. 3, line 23, after "1991" insert --now U.S. Patent 5,162,679 issued on November 10, 1992--

Signed and Sealed this

Second Day of November, 1993

Attest:

BRUCE LEHMAN

Attesting Officer

Commissioner of Patents and Trademarks